United States Patent
Yoo et al.

(10) Patent No.: US 12,308,584 B2
(45) Date of Patent: May 20, 2025

(54) ELECTRONIC DEVICE FOR REDUCING TRANSMISSION LOSS

(71) Applicant: Samsung Electronics Co., Ltd., Gyeonggi-do (KR)

(72) Inventors: Jangsun Yoo, Gyeonggi-do (KR); Hanyeop Lee, Gyeonggi-do (KR); Donguk Choi, Gyeonggi-do (KR); Kyungbin Kim, Gyeonggi-do (KR); Jihye Moon, Gyeonggi-do (KR); Myeonggil Lee, Gyeonggi-do (KR); Jongin Lee, Gyeonggi-do (KR); Eunseok Hong, Gyeonggi-do (KR); Gun Lim, Gyeonggi-do (KR)

(73) Assignee: Samsung Electronics Co, Ltd, Suwon-si (KR)

( * ) Notice: Subject to any disclaimer, the term of this patent is extended or adjusted under 35 U.S.C. 154(b) by 534 days.

(21) Appl. No.: 17/841,950

(22) Filed: Jun. 16, 2022

(65) Prior Publication Data
US 2022/0399687 A1 Dec. 15, 2022

Related U.S. Application Data

(63) Continuation of application No. PCT/KR2022/007091, filed on May 18, 2022.

(30) Foreign Application Priority Data

Jun. 9, 2021 (KR) .......................... 10-2021-0074709

(51) Int. Cl.
*H01R 24/50* (2011.01)
*H01R 12/53* (2011.01)
(Continued)

(52) U.S. Cl.
CPC ............. *H01R 24/50* (2013.01); *H01R 12/53* (2013.01); *H05K 1/0263* (2013.01); *H05K 1/147* (2013.01); *H01R 12/59* (2013.01); *H01R 2103/00* (2013.01)

(58) Field of Classification Search
CPC .... H01R 24/50; H01R 2103/00; H01R 12/53; H01R 12/59; H04K 1/0263
See application file for complete search history.

(56) References Cited

U.S. PATENT DOCUMENTS 10,439,323 B1 10/2019 Higgins
10,616,995 B2 4/2020 Kim
(Continued)

FOREIGN PATENT DOCUMENTS

JP 6541032 B2 6/2019
JP 2020-65251 A 4/2020
(Continued)

*Primary Examiner* — Wayne H Cai
(74) *Attorney, Agent, or Firm* — Cha & Reiter LLC

(57) ABSTRACT

An electronic device according to certain embodiments includes a first circuit board, a second circuit board including a communication module, a first antenna module disposed to be separate from the communication module, a flexible cable including a first connector connected to the first circuit board, a second connector connected to the first antenna module, a first extension extending between the first connector and the second connector, and a first receptacle disposed in the first extension, and a first coaxial cable including a third connector connected to the communication module, a fourth connector connected to the first receptacle, and a second extension extending between the third connector and the fourth connector.

11 Claims, 14 Drawing Sheets

(51) Int. Cl.
   *H05K 1/02*     (2006.01)
   *H05K 1/14*     (2006.01)
   *H01R 12/59*     (2011.01)
   *H01R 103/00*    (2006.01)

(56)                References Cited

U.S. PATENT DOCUMENTS

| | | | |
|---|---|---|---|
| 10,938,453 | B2 | 3/2021 | Chien et al. |
| 2019/0014656 | A1 | 1/2019 | Kim |
| 2019/0190214 | A1* | 6/2019 | Choi ................... G06F 1/163 |
| 2022/0320775 | A1* | 10/2022 | Kato ................. H01R 13/6592 |

FOREIGN PATENT DOCUMENTS

| | | |
|---|---|---|
| KR | 10-0439343 B1 | 7/2004 |
| KR | 10-1443339 B1 | 9/2014 |
| KR | 10-2016-0019307 A | 2/2016 |
| KR | 10-2017-0100749 A | 9/2017 |
| KR | 10-2018-0054230 A | 5/2018 |
| KR | 10-2019-0038264 A | 4/2019 |

\* cited by examiner

ELECTRONIC DEVICE FOR REDUCING TRANSMISSION LOSS

CROSS-REFERENCE TO RELATED APPLICATIONS

This application is a Continuation of and claims the benefit under 35 USC §§ 119(a) and 120 to PCT International Application No. PCT/KR2022/007091, which was filed on May 18, 2022, and to Korean Patent Application No. 10-2021-0074709 filed on Jun. 9, 2021, in the Korean Intellectual Property Office, the entire disclosures of which are incorporated herein by reference for all purposes.

BACKGROUND

1. Field

One or more embodiments of the instant disclosure generally relates to an electronic device that exhibits reduced transmission loss, and more particularly, to an electronic device in which transmission loss of a cable connecting a communication module and an antenna module disposed far apart from each other is reduced.

2. Description of Related Art

In the art, there are known electronic devices that each includes a communication module and an antenna module, which are used to provide the user with various services. The antenna module may transmit and receive electromagnetic waves of various frequency bands, and technologies for reducing transmission loss (e.g., insertion loss) between the communication module and the antenna module are under development.

SUMMARY

According to an example embodiment, an electronic device includes a first circuit board, a second circuit board including a communication module, a first antenna module disposed to be separate from the communication module, a flexible cable including a first connector connected to the first circuit board, a second connector connected to the first antenna module, a first extension extending between the first connector and the second connector, and a first receptacle disposed in the first extension, and a first coaxial cable including a third connector connected to the communication module, a fourth connector connected to the first receptacle, and a second extension extending between the third connector and the fourth connector.

According to an example embodiment, an electronic device includes a first circuit board, a second circuit board including a communication module, a first antenna module disposed to be separate from the communication module, a third circuit board including a first connector connected to the first circuit board, a second connector connected to the first antenna module, and a first receptacle, and a first coaxial cable including a third connector connected to the communication module, a fourth connector connected to the first receptacle, and a first extension extending between the third connector and the fourth connector.

According to an example embodiment, an electronic device includes a first circuit board, a second circuit board including a communication module, a first antenna module disposed to be separate from the communication module and including a first receptacle, and a first coaxial cable including a first connector connected to the communication module, a second connector connected to the first receptacle, and a first extension extending between the first connector and the second connector.

Additional aspects will be set forth in part in the description which follows and, in part, will be apparent from the description, or may be learned by practice of the presented embodiments.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
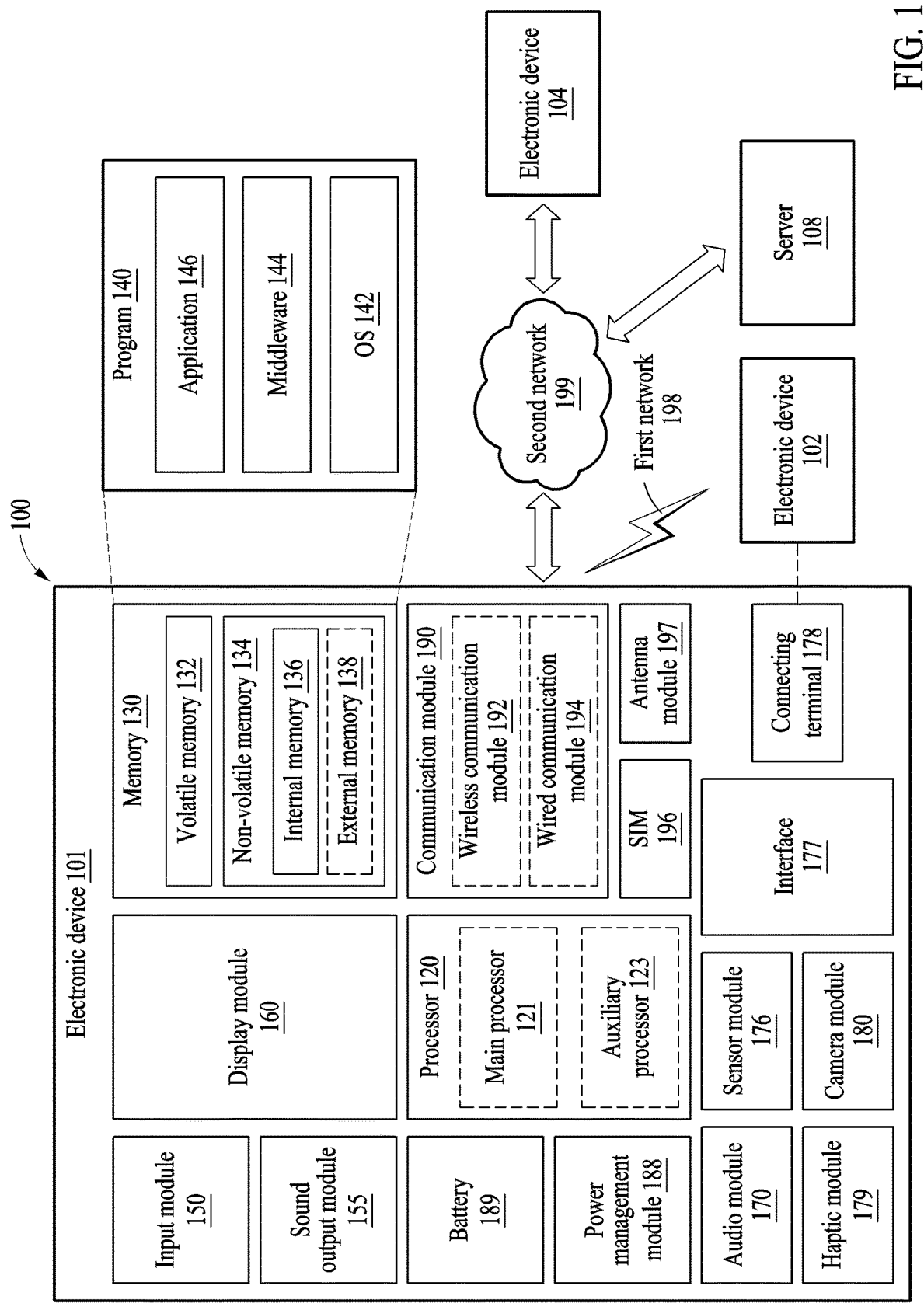
FIG. 1 is a block diagram illustrating an example electronic device in a network environment according to an example embodiment.
Figure 2A:
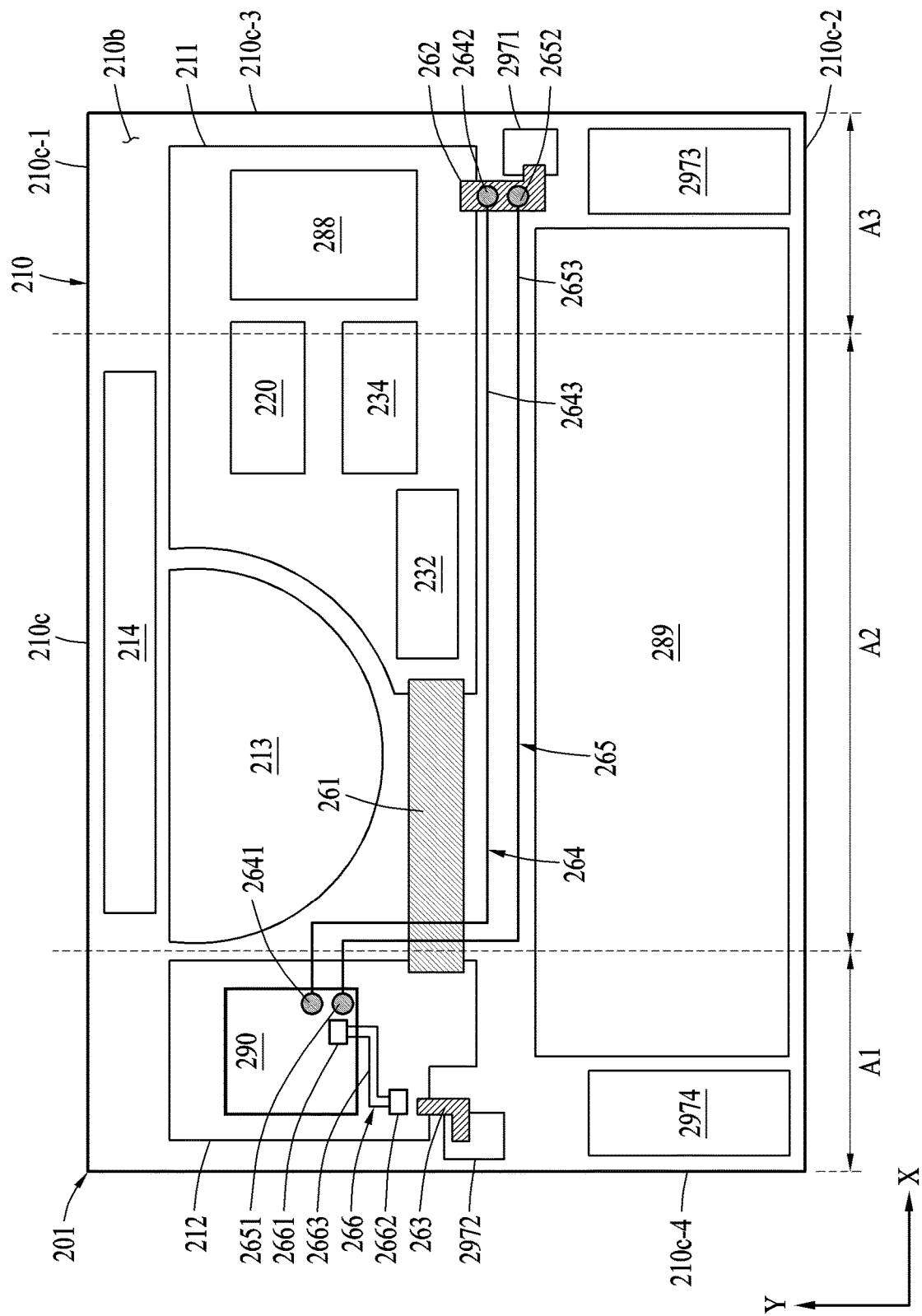
FIG. 2A is a block diagram illustrating an example electronic device according to an example embodiment.
Figure 2B:
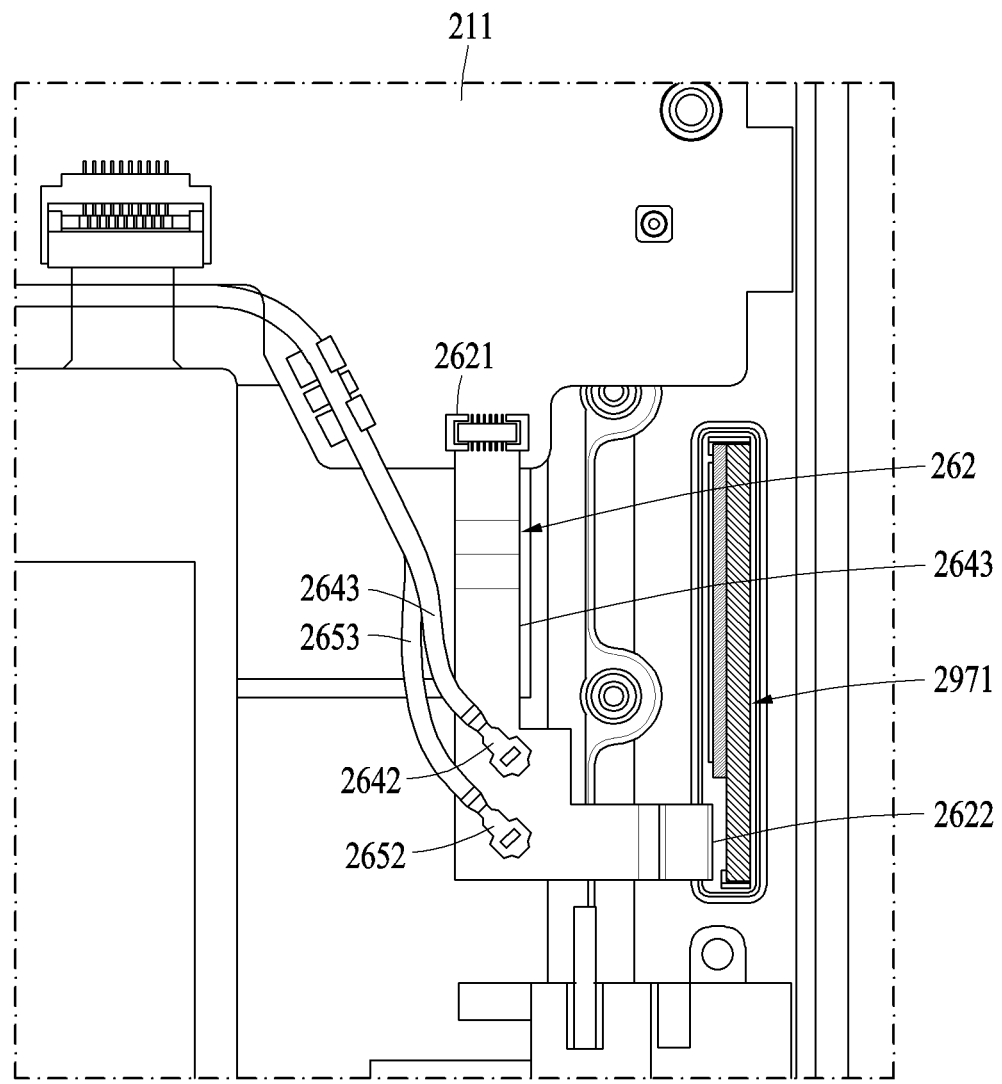
FIG. 2B is a diagram illustrating an example structure connecting a coaxial cable and an antenna module in an electronic device according to an example embodiment.
Figure 2C:
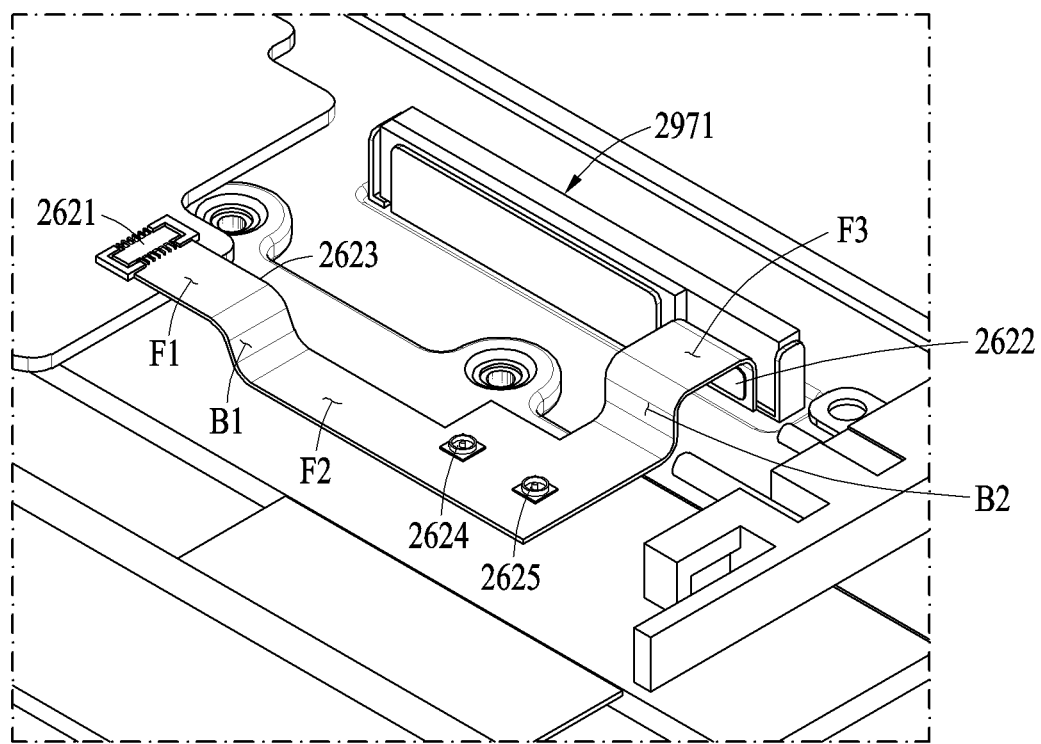
FIG. 2C is a perspective view of the structure of FIG. 2B, in which the coaxial cable is omitted.
Figure 2D:
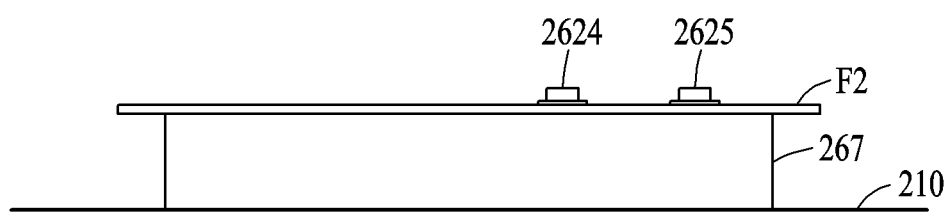
FIG. 2D is a side view of the structure of FIG. 2C.

Certain embodiments of the disclosure may provide an electronic device in which transmission loss between its communication module and its antenna module is reduced.

Hereinafter, various example embodiments will be described in greater detail with reference to the accompanying drawings. When describing the example embodiments with reference to the accompanying drawings, like reference numerals refer to like elements and a repeated description related thereto will be omitted.

FIG. 1 is a block diagram illustrating an example electronic device in a network environment according to an embodiment.

Referring to FIG. 1, an electronic device 101 in a network environment 100 may communicate with an electronic device 102 via a first network 198 (e.g., a short-range wireless communication network), or communicate with at least one of an electronic device 104 and a server 108 via a second network 199 (e.g., a long-range wireless communication network). According to an example embodiment, the electronic device 101 may communicate with the electronic device 104 via the server 108. According to an example embodiment, the electronic device 101 may include a processor 120, a memory 130, an input module 150, a sound output module 155, a display module 160, an audio module 170, and a sensor module 176, an interface 177, a connecting terminal 178, a haptic module 179, a camera module 180, a power management module 188, a battery 189, a communication module 190, a subscriber identification module (SIM) 196, or an antenna module 197. In some example embodiments, at least one (e.g., the connecting terminal 178) of the above components may be omitted from the electronic device 101, or one or more other components may be added in the electronic device 101. In some example embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to an example embodiment, as at least a part of data processing or computation, the processor 120 may store a command or data received from another component (e.g., the sensor module 176 or the communication module 190) in a volatile memory 132, process the command or data stored in the volatile memory 132, and store resulting data in a non-volatile memory 134. According to an example embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently of, or in conjunction with, the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display device 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). According to an example embodiment, the auxiliary processor 123 (e.g., an ISP or a CP) may be implemented as a portion of another component (e.g., the camera module 180 or the communication module 190) that is functionally related to the auxiliary processor 123. According to an example embodiment, the auxiliary processor 123 (e.g., an NPU) may include a hardware structure specified for artificial intelligence (AI) model processing. An AI model may be generated by machine learning. Such learning may be performed by, for example, the electronic device 101 in which the AI model is performed, or performed via a separate server (e.g., the server 108). Learning algorithms may include, but are not limited to, for example, supervised learning, unsupervised learning, semi-supervised learning, or reinforcement learning. The AI model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The AI model may alternatively or additionally include a software structure other than the hardware structure.

The memory 130 may store various data used by at least one component (e.g., the processor 120 or the sensor module 176) of the electronic device 101. The data may include, for example, software (e.g., the program 140) and input data or output data for a command related thereto. The memory 130 may include the volatile memory 132 or the non-volatile memory 134. The non-volatile memory 134 may include an internal memory 136 and an external memory 138.

The program 140 may be stored as software in the memory 130, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing records. The receiver may be used to receive an incoming call. According to an example embodiment, the receiver may be implemented separately from the speaker or as a part of the speaker.

The display module 160 may visually provide information to the outside (e.g., a user) of the electronic device 101. The display module 160 may include, for example, a display, a hologram device, or a projector, and a control circuitry to control a corresponding one of the display, the hologram device, and the projector. According to an example embodiment, the display module 160 may include a touch sensor adapted to sense a touch, or a pressure sensor adapted to measure an intensity of a force incurred by the touch.

The audio module 170 may convert a sound into an electric signal or vice versa. According to an example embodiment, the audio module 170 may obtain the sound via the input module 150 or output the sound via the sound output module 155 or an external electronic device (e.g., the electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electric signal or data value corresponding to the detected state. According to an example embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with an external electronic device (e.g., the electronic device 102) directly (e.g., wiredly) or wirelessly. According to an example embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to an example embodiment, the connecting terminal 178 may include, for example, an HDMI connector, a USB connector, an SD card connector, or an audio connector (e.g., a headphone connector).

The haptic module 179 may convert an electric signal into a mechanical stimulus (e.g., a vibration or a movement) or an electrical stimulus which may be recognized by a user via his or her tactile sensation or kinesthetic sensation. According to an example embodiment, the haptic module 179 may include, for example, a motor, a piezoelectric element, or an electric stimulator.

The camera module 180 may capture a still image and moving images. According to an example embodiment, the camera module 180 may include one or more lenses, image sensors, ISPs, or flashes.

The power management module 188 may manage power supplied to the electronic device 101. According to an example embodiment, the power management module 188 may be implemented as, for example, at least a part of a power management integrated circuit (PMIC).

The battery 189 may supply power to at least one component of the electronic device 101. According to an example embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and an external electronic device (e.g., the electronic device 102, the electronic device 104, or the server 108) and performing communication via the established communication channel. The communication module 190 may include one or more communication processors that are operable independently of the processor 120 (e.g., an AP) and that support direct (e.g., wired) communication or wireless communication. According to an example embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide area network (WAN)). These various types of communication modules may be implemented as a single component (e.g., a single chip), or may be implemented as multiple components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and a next-generation communication technology, e.g., a new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beamforming, or a large scale antenna. The wireless communication module 192 may support various requirements specified in the electronic device 101, an external electronic device (e.g., the electronic device 104), or a network system (e.g., the second network 199). According to an example embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC. The antenna module 197 may transmit or receive a signal or power to or from the outside (e.g., an external electronic device) of the electronic device 101. According to an example embodiment, the antenna module 197 may include an antenna including a radiating element including a conductive material or a conductive pattern formed in or on a substrate (e.g., a printed circuit board (PCB)). According to an example embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. According to an example embodiment, another component (e.g., a radio frequency integrated circuit (RFIC)) other than the radiating element may be additionally formed as a part of the antenna module 197.

According to certain example embodiments, the antenna module 197 may form a mmWave antenna module. According to an example embodiment, the mmWave antenna module may include a PCB, an RFIC disposed on a first surface (e.g., a bottom surface) of the PCB or adjacent to the first surface and capable of supporting a designated high-frequency band (e.g., the mmWave band), and a plurality of antennas (e.g., array antennas) disposed on a second surface (e.g., a top or a side surface) of the PCB or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general-purpose input and output (GPIO), serial peripheral interface (SPI), or mobile industry processor interface (MIPI)).

According to an example embodiment, commands or data may be transmitted or received between the electronic device 101 and the external electronic device 104 via the server 108 coupled with the second network 199. Each of the external electronic devices 102 and 104 may be a device of the same type as or a different type from the electronic device 101. According to an example embodiment, all or some of operations to be executed by the electronic device 101 may be executed at one or more of the external electronic devices 102, 104, and 108. For example, if the electronic device 101 needs to perform a function or a service automatically, or in response to a request from a user or another device, the electronic device 101, instead of, or in addition to, executing the function or the service, may request one or more external electronic devices to perform at least a part of the function or the service. The one or more external electronic devices receiving the request may perform the at least part of the function or the service requested, or an additional function or an additional service related to the request, and may transfer an outcome of the performing to the electronic device 101. The electronic device 101 may provide the outcome, with or without further processing of the outcome, as at least a part of a reply to the request. To that end, a cloud computing, distributed computing, mobile edge computing (MEC), or client-server computing technology may be used, for example. The electronic device 101 may provide ultra-low latency services using, e.g., distributed computing or mobile edge computing. In an example embodiment, the external electronic device 104 may include an Internet-of-things (IoT) device. The server 108 may be an intelligent server using machine learning and/or a neural network. According to an example embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

An electronic device according to certain example embodiments of the present disclosure may be a device of various types. The electronic device may include, for example, a portable communication device (e.g., a smartphone, etc.), a computing device, a portable multimedia device, a portable medical device, a camera, a wearable device, or a home appliance. However, the electronic device is not limited to the foregoing examples.

It should be construed that certain example embodiments of the present disclosure and the terms used therein are not intended to limit the technological features set forth herein to some particular embodiments but include various changes, equivalents, or replacements of the example embodiments. In connection with the description of the drawings, like reference numerals may be used for similar or related components. It should be understood that a singular form of a noun corresponding to an item may include one or more of the things, unless the relevant context clearly indicates otherwise. As used herein, "A or B," "at least one of A and B," "at least one of A or B," "A, B, or C," "at least one of A, B, and C," and "A, B, or C," each of which may include any one of the items listed together in the corresponding one of the phrases, or all possible combinations thereof. Although terms of "first" or "second" are used to explain various components, the components are not limited to the terms. These terms should be used only to distinguish one component from another component. For example, a "first" component may be referred to as a "second" component, or similarly, and the "second" component may be referred to as the "first" component within the scope of the right according to the concept of the present disclosure. It should also be understood that, when a component (e.g., a first component) is referred to as being "connected to" or "coupled to" another component with or without the term "functionally" or "communicatively," the component can be connected or coupled to the other component directly (e.g., wiredly), wirelessly, or via a third component.

As used in connection with certain example embodiments of the disclosure, the term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an example embodiment, the module may be implemented in the form of an application-specific integrated circuit (ASIC).

Certain example embodiments set forth herein may be implemented as software (e.g., the program 140) including one or more instructions that are stored in a storage medium (e.g., the internal memory 136 or the external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to certain example embodiments, a method according to an example embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain example embodiments, each component (e.g., a module or a program) of the above-described components may include a single entity or multiple entities, and some of the multiple entities may be separately disposed in different components. According to certain example embodiments, one or more of the above-described components or operations may be omitted, or one or more other components or operations may be added. Alternatively or additionally, a plurality of components (e.g., modules or programs) may be integrated into a single component. In such a case, according to certain example embodiments, the integrated component may still perform one or more functions of each of the plurality of components in the same or similar manner as they are performed by a corresponding one of the plurality of components before the integration. According to certain example embodiments, operations performed by the module, the program, or another component may be carried out sequentially, in parallel, repeatedly, or heuristically, or one or more of the operations may be executed in a different order or omitted, or one or more other operations may be added.

Referring to FIGS. 2A through 2D, according to an example embodiment, an electronic device 201 may include a housing 210 including a first surface (e.g., front surface) (not shown), a second surface 210b (e.g., rear surface) opposite to the first surface, and a plurality of third surfaces 210c (e.g., first side surface 210c-1, second side surface 210c-2, third side surface 210c-3, and fourth side surface 210c-4) defining the internal space of the electronic device 201 between with the first surface and the second surface 210b. The third surfaces 210c may include the first side surface 210c-1 disposed on a first side (e.g., upper side), the second side surface 210c-2 disposed on a second side (e.g., lower side), the third side surface 210c-3 disposed on a third side (e.g., right side) between the first side surface 210c-1 and the second side surface 210c-2, and the fourth side surface 210c-4 disposed on a fourth side (e.g., left side) between the first side surface 210c-1 and the second side surface 210c-2. The housing 210 may be divided into a plurality of areas (e.g., A1, A2, and A3). For example, the housing 210 may have a first side area A1 (e.g., left area), a middle area A2, and a second side area A3 (e.g., right area) opposite to the first side area A1.

According to an example embodiment, the electronic device 201 may include a first circuit board 211, a second circuit board 212, a cooling module 213, a heat plate 214, a plurality of antenna modules 2971, 2972, 2973, and 2974 (e.g., the antenna module 197 of FIG. 1), and a battery 289 (e.g., the battery 189 of FIG. 1). The first circuit board 211 may include a processor 220 (e.g., the processor 120 of FIG. 1), a volatile memory 232 (e.g., the volatile memory 132 of FIG. 1), a non-volatile memory 234 (e.g., the non-volatile memory 134 of FIG. 1), and a power management module 288 (e.g., the power management module 188 of FIG. 1). The second circuit board 212 may include a communication module 290 (e.g., the communication module 190 of FIG. 1). The cooling module 213 may include a fan.

The first circuit board 211 may be disposed in at least a portion of the middle area A2 and/or at least a portion of the second side area A3. The second circuit board 212 may be disposed in at least a portion of the first side area A1. The cooling module 213 and the heat plate 214 may be disposed in at least a portion of the middle area A2. The battery 289 may be disposed in at least a portion of the first side area A1, at least a portion of the middle area A2, and at least a portion of the second side area A3. The first circuit board 211, the second circuit board 212, the cooling module 213, and the heat plate 214 may be disposed in one area (e.g., upper area) of the housing 210, and the battery 289 may be disposed in another area (e.g., lower area) of the housing 210.

The antenna modules 2971, 2972, 2973, and 2974 may include the first antenna module 2971 and the second antenna module 2972 configured to transmit and receive electromagnetic waves of a first band (e.g., approximately 28 gigahertz (GHz)) which is a relatively high-frequency band, and the third antenna module 2973 and the fourth antenna module 2974 configured to transmit and receive electromagnetic waves of a second band (e.g., approximately 6 GHz or less) which is a relatively low-frequency band. For example, the first antenna module 2971 and the second antenna module 2972 may implement an mmWave antenna module, and the third antenna module 2973 and the fourth antenna module 2974 may implement a frequency range 1 (FR1) antenna module.

The first antenna module 2971 and the third antenna module 2973 may be disposed in the second side area A3, and the second antenna module 2972 and the fourth antenna module 2974 may be disposed in the first side area A1. The first antenna module 2971 and the third antenna module 2973 may be disposed on one side (e.g., right side) of the battery 298, and the second antenna module 2972 and the fourth antenna module 2974 may be disposed on another side (e.g., left side) of the battery 289. The first antenna module 2971 may be disposed to be separate from the communication module 290 by a first distance, and the second antenna module 2972 may be disposed to be separate from the communication module 290 by a second distance that is less than the first distance.

The electronic device 201 may include a plurality of flexible cables 261, 262, and 263. For example, the first flexible cable 261 may be configured to connect the first circuit board 211 and the second circuit board 212, the second flexible cable 262 may be configured to connect the first circuit board 211 and the first antenna module 2971, and the third flexible cable 263 may be configured to connect the second circuit board 212 and the second antenna module 2972. The second flexible cable 262 may include a first connector 2621 connected to the first circuit board 211, a second connector 2622 connected to the first antenna module 2971, and a first extension 2623 extending between the first connector 2621 and the second connector 2622.

The first extension 2623 may have a first flat face F1 connected to the first connector 2621, a second flat face F2 disposed on a plane different from that of the first flat face F1, a third flat face F3 connected to the second connector 2622 and disposed on another plane different from that of the second flat face F2, a first bent face B1 disposed between the first flat face F1 and the second flat face F2, and a second bent face B2 disposed between the second flat face F2 and the third flat face F3.

The second flexible cable 262 may include a first receptacle 2624 and a second receptacle 2625. The first receptacle 2624 and the second receptacle 2625 may be disposed to be offset from each other on the second flat face F2. For example, the first receptacle 2624 may be disposed near the first connector 2621, and the second receptacle 2625 may be disposed near the second connector 2622. The first receptacle 2624 and the second receptacle 2625 may be electrically connected to the first extension 2623.

The second flexible cable 262 may be implemented by a flexible printed circuit board (FPCB). For example, the second flexible cable 262 may be an FPCB radio frequency (RF) cable (FRC).

The second flexible cable 262 may include at least one line through which RF signals, phase control signals, and power may pass, and/or may also include a ground (GND).

According to an example embodiment, the first extension 2623 may have the single second bent face B2 between the second connector 2622 and the second flat face F2 on which the first receptacle 2624 and the second receptacle 2625 are disposed. That is, the first bent face B1 may be omitted. According to another example embodiment, in the first extension 2623, the second flat face F2 on which the first receptacle 2624 and the second receptacle 2625 are disposed may be directly connected to the second connector 2622 without the second bent face B2. That is, the second flat face F2 may be on the same plane as the second connector 2622 such that it does not need to be bent to be connected to the second connector 2622. According to an embodiment, to reduce the insertion loss between the first receptacle 2624, the second receptacle 2625, and the first antenna module 2971, one or more bent faces may be formed.

According to an example embodiment, the electronic device 201 may include a first coaxial cable 264 and a second coaxial cable 265 configured to connect the communication module 290 and the first antenna module 2971. The communication module 290 and the first antenna module 2971 may be disposed to be separate from each other by a relatively long distance therebetween. Thus, to optimize the performance of the first antenna module 2971 configured to transmit and receive electromagnetic waves in the relatively high-frequency first band and to reduce insertion loss, the first coaxial cable 264 and the second coaxial cable 265 may be used to connect the communication module 290 and the first antenna module 2971.

The first coaxial cable 264 may include a third connector 2641 connected to the communication module 290, a fourth connector 2642 connected to the first receptacle 2624, and a second extension 2643 extending between the third connector 2641 and the fourth connector 2642. The second coaxial cable 265 may include a fifth connector 2651 connected to the communication module 290, a sixth connector 2652 connected to the second receptacle 2625, and a third extension 2653 extending between the fifth connector 2651 and the sixth connector 2652. The above implements a structure in which the first coaxial cable 264 and the second coaxial cable 265 are directly connected to the second flexible cable 262, which may reduce the insertion loss in the signal transfer between the communication module 290 and the first antenna module 2971 disposed separately from each other by a relatively long distance, while decreasing signal loss in board-to-board connector(s) (e.g., the first connector 2621 and the second connector 2622) without substantially increasing the length of the second flexible cable 262.

According to an example embodiment, the electronic device 201 may include a reinforcing portion 267 configured to reinforce the second flat face F2 to maintain or increase rigidity of the second flat face F2 of the first extension 2623 on which the first receptacle 2624 and the second receptacle 2625 are disposed. The reinforcing portion 267 may have a structure that is suitable to support the second flat face F2 (e.g., reinforcing plate, reinforcing rib, and other reinforcing structures) while extending from one surface (e.g., the second surface 210b) of the housing 210 to the second flat face F2.

According to an example embodiment, the electronic device 201 may include a compatible cable 266 configured to connect the communication module 290 and the second antenna module 2972. The compatible cable 266 may include a seventh connector 2661 connected to the communication module 290, an eighth connector 2662 connected to the second antenna module 2972 through the third flexible cable 263, and a plurality of fourth extensions 2663 (e.g., two fourth extensions) extending between the seventh connector 2661 and the eighth connector 2662. The communication module 290 and the second antenna module 2972 may be disposed to be relatively close to each other. Thus, even when the second antenna module 2972 transmits or receives electromagnetic waves in the relatively high-frequency first band, the compatible cable 266 may be used as the cable connecting the communication module 290 and the second antenna module 2972.

Figure 3A:
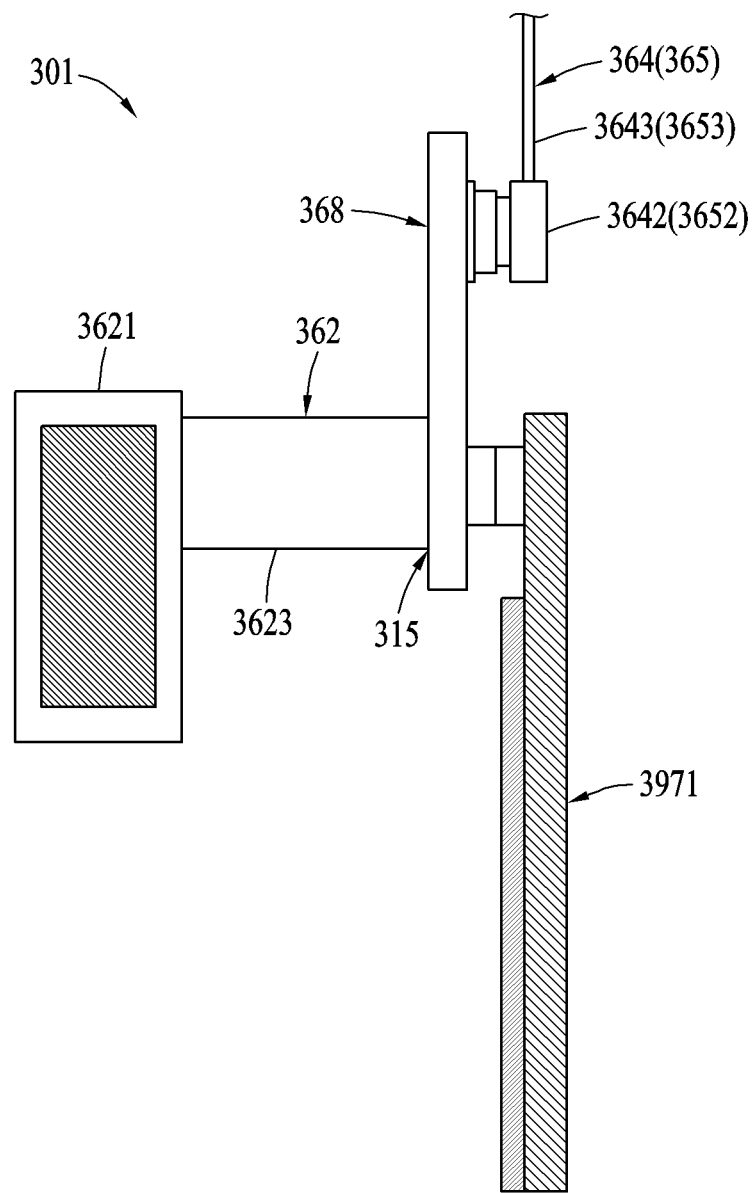
FIG. 3A is a diagram illustrating another example structure connecting a coaxial cable and an antenna module in an electronic device according to an example embodiment.
Figure 3B:
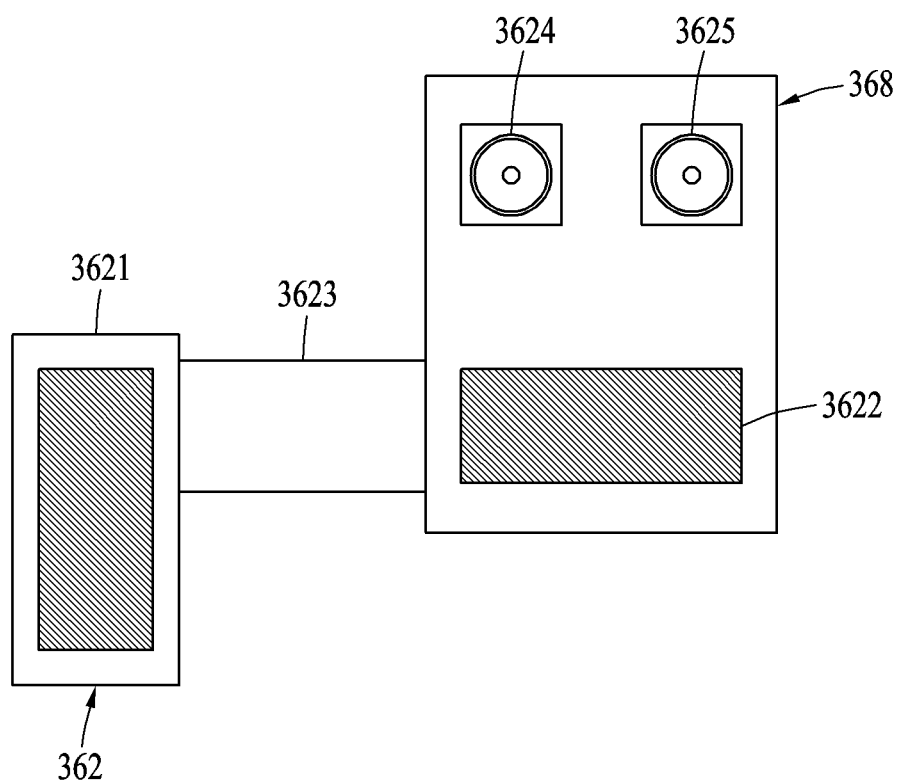
FIG. 3B is a top view of the structure of FIG. 3A, in which the coaxial cable is omitted.

Referring to FIGS. 3A and 3B, according to an example embodiment, an electronic device 301 may include a housing (e.g., the housing 210), a first circuit board (e.g., the first circuit board 211), a second circuit board (e.g., the second circuit board 212), a cooling module (e.g., the cooling module 213), a heat plate (e.g., the heat plate 214), a plurality of antenna modules 3971 (e.g., the antenna modules 2971, 2972, 2973, and 2974), a battery (e.g., the battery 289), a plurality of flexible cables 362 (e.g., implementing one or more of the flexible cables 261, 262, and 263), a plurality of coaxial cables 364 and 365 (e.g., the first coaxial cable 264 and the second coaxial cable 265), and a compatible cable (e.g., the compatible cable 266).

According to an example embodiment, the electronic device 301 may include a third circuit board 315 that may be used to reduce the insertion loss between a communication module and the antenna module 3971 (e.g., the first antenna module 2971). The third circuit board 315 may include the flexible cable 362 (e.g., the second flexible cable 262) and a sub-board 368. The flexible cable 362 may include a first connector 3621 (e.g., the first connector 2621) connected to the first circuit board, and an extension 3623 (e.g., the first extension 2623) extending from the first connector 3621 and electrically connected to the sub-board 368. The extension 3623 and the sub-board 368 may be an integrated component. The sub-board 368 may include a plurality of receptacles 3624 and 3625 (e.g., the first receptacle 2624 and the second receptacle 2625) to which connectors 3642 and 3652 (e.g., the fourth connector 2642 and the sixth connector 2652) connected to respective extensions 3643 and 3653 (e.g., the second extension 2643 and the third extension 2653) of the coaxial cables 364 and 365 are connected. The sub-board 368 may include a second connector 3622 connected to the antenna module 3971. The above implements a structure in which the coaxial cables 364 and 365 are directly connected to the sub-board 368, which may reduce the insertion loss in signal transfer between the communication module and the antenna module 3971 disposed to be separate from each other by a relatively long distance, while reducing the signal loss in a board-to-board connector (e.g., the second connector 3622) irrespective of the flexible cable 362 connecting the first circuit board and the antenna module 3971. In addition, the coaxial cables 364 and 365 may not be directly connected to the flexible cable 362, which provides greater freedom for the design of the flexible cable 362.

Figure 4:
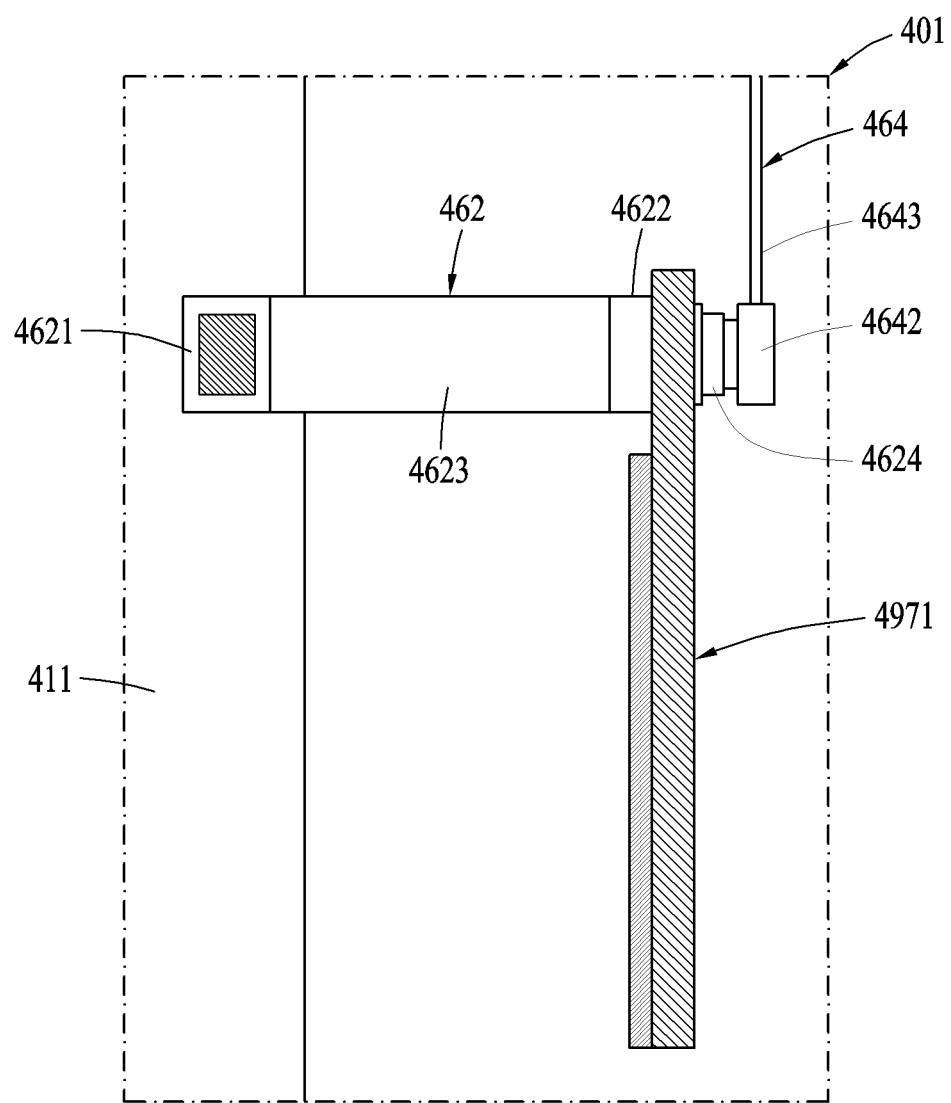
FIG. 4 is a diagram illustrating still another example structure connecting a coaxial cable and an antenna module in an electronic device according to an example embodiment.

Referring to FIG. 4, according to an example embodiment, an electronic device 401 may include a housing (e.g., the housing 210), a first circuit board 411 (e.g., the first circuit board 211), a second circuit board (e.g., the second circuit board 212), a cooling module (e.g., the cooling module 213), a heat plate (e.g., the heat plate 214), a plurality of antenna modules 4971 (e.g., the antenna modules 2971, 2972, 2973, and 2974), a battery (e.g., the battery 289), a plurality of flexible cables 462 (e.g., the flexible cables 261, 262, and 263), a plurality of coaxial cables 464 (e.g., the first coaxial cable 264 and the second coaxial cable 265), and a compatible cable (e.g., the compatible cable 266). For example, a flexible cable 462 may include a connector 4621 (e.g., the first connector 2621) connected to the first circuit board 411, a connector 4622 (e.g., the second connector 2622) connected to the antenna modules 4971, and an extension 4623 (e.g., the first extension 2623) extending between the connectors 4621 and 4622.

The coaxial cables 464 may be directly connected to the antenna modules 4971. For example, an antenna module 4971 (e.g., the first antenna module 2971) may include a plurality of receptacles 4624 to which connectors 4642 (e.g., the fourth connector 2642 and the sixth connector 2652) connected to respective extensions 4643 (e.g., the second extension 2643 and the third extension 2653) of the coaxial cables 464 are connected. The above implements a structure in which the coaxial cables 464 are directly connected to the antenna module 4971, which may reduce the insertion loss in signal transfer between the communication module and the antenna module 4971 disposed to be separate from each other by a relatively long distance, without causing substantial signal loss in a board-to-board connector (e.g., the second connector 3622), irrespective of the flexible cable 462 connecting the first circuit board 411 and the antenna module 4971.

Figure 5:
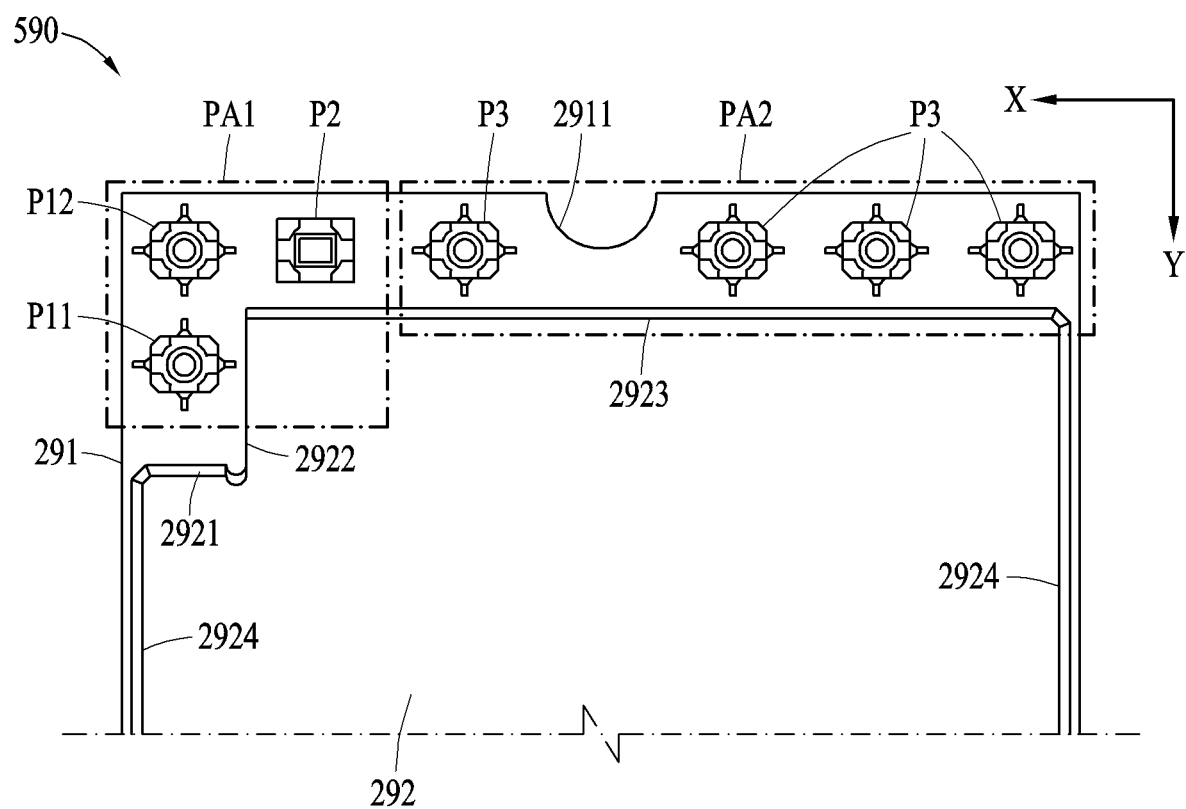
FIG. 5 is a diagram illustrating an example communication module in an electronic device according to an example embodiment.

Referring to FIG. 5, according to an example embodiment, a communication module 590 (e.g., the communication module 290) may be deployed with a structure that is provided to improve insertion loss in the signal transfer between the communication module 590 and an antenna module (e.g., the first antenna module 2971) that are disposed to be separate from each other by a relatively long distance. This may be done without having to change the standard size of the communication module.

The communication module 590 may include a board 291 and a shield 292 configured to shield at least a portion of the board 291. The shield 292 may have side edges 2924 extending in a first direction (e.g., −Y direction) along edges of the board 291. To define a first port area PA1 and a second port area PA2 of the board 291 that are not substantially covered by the shield 292, the shield 292 may have a first edge 2921 extending in a second direction (e.g., −X direction) from one (e.g., the left edge) of the side edges 2924, a second edge 2922 connected to the first edge 2921 and extending in the first direction (e.g., the −Y direction), and a third edge 2923 configured to connect the second edge 2922 and another one (e.g., the right edge) of the side edges 2924 and extending in the second direction. The first port area PA1 may be defined by at least a portion (e.g., at least a portion of the left edge and at least a portion of an upper edge) of the edges of the board 291 and by at least a portion of the first edge 2921, the second edge 2922, and the third edge 2923 of the shield 292. The second port area PA2 may be defined by at least a portion (e.g., the remaining portion of the upper edge and at least a portion of the right edge) of the edges of the board 291 and the remaining portion of the third edge 2923 of the shield 292.

The first port area PA1 may include a first antenna port P11 surrounded by at least a portion (e.g., the left edge) of side edges of the board 291 and by the first edge 2921 and the second edge 2922 of the shield 292, a second antenna port P12 disposed above the first antenna port P11 along the side edge (e.g., the left edge) of the board 291 and surrounded by at least a portion of the side edge and at least a portion of the upper edge of the board 291, and a third antenna port P2 disposed beside the second antenna port P12 along the upper edge of the board 291 and surrounded by at least a portion of the upper edge of the board 291 and by the third edge 2923 of the shield 292.

The first antenna port P11 and the second antenna port P12 may be of the same type, and be a different type of antenna port than the third antenna port P2. For example, a connector (e.g., the third connector 2641) of a first coaxial cable (e.g., the first coaxial cable 264) may be connected to one of the first antenna port P11 and the second antenna port P12. In this example, a connector (e.g., the fifth connector 2651) of a second coaxial cable (e.g., the second coaxial cable 265) may be connected to the other of the first antenna port P11 and the second antenna port P12. In addition, a connector (e.g., the seventh connector 2661) of a compatible cable (e.g., the compatible cable 266) may be connected to the third antenna port P2.

The second port area PA2 may include a plurality of fourth antenna ports P3 disposed between at least a portion of one edge (e.g., the upper edge) of the board 291 and the third edge 2923 of the shield 292 and arranged in one direction (e.g., +/−X direction) along the edges. The board 291 may include a notch 2911 formed in the second port area PA2, and at least a portion of the fourth antenna ports P3 may be disposed on a first side (e.g., left side) with respect to the notch 2911, and the remaining portion of the fourth antenna ports P3 may be disposed on a second side (e.g., right side) opposite to the first side with respect to the notch 2911. For example, the fourth antenna ports P3 may be connected to cables connected to antenna module(s) (e.g., the third antenna module 2973 and the fourth antenna module 2974) configured to transmit or receive electromagnetic waves in the relatively low-frequency second band (e.g., approximately 6 GHz or less).

Figure 6:
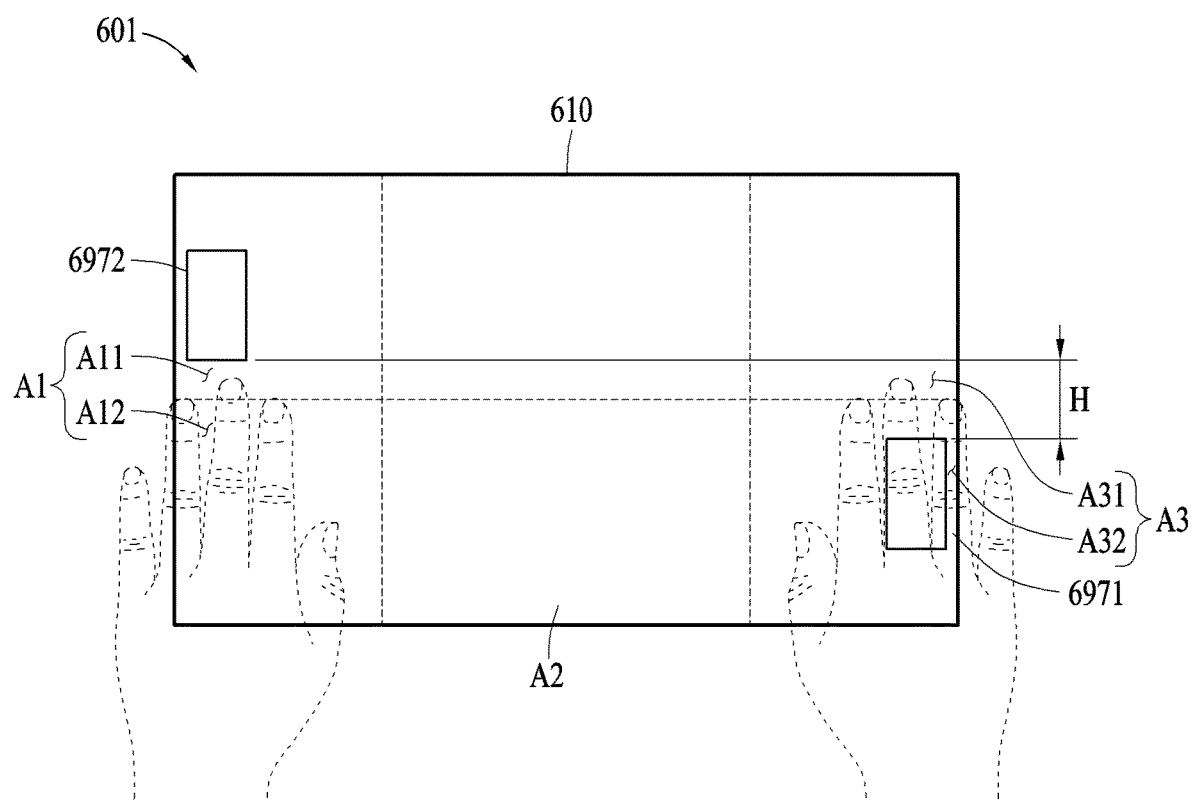
FIG. 6 is a diagram illustrating an example arrangement of antenna modules in an electronic device according to an example embodiment.

Referring to FIG. 6, according to an example embodiment, in an electronic device 601 (e.g., the electronic device 201), a first antenna module 6971 (e.g., the first antenna module 2971) and a second antenna module 6972 (e.g., the second antenna module 2972) may be asymmetrically disposed in a housing 610. In the illustrated arrangement according to an example embodiment, the first antenna module 6971 may be disposed in a second lower area A32 of a second side area A3 and the second antenna module 6972 may be disposed in a first upper area A11 of a first side area A1, and the first antenna module 6971 and the second antenna module 6972 may be separate from each other by a predetermined distance H in one direction (e.g., vertical direction) of the housing 610. In another arrangement not illustrated, the first antenna module 6971 may be disposed in a second upper area A31 of the second side area A3 and the second antenna module 6972 may be disposed in a first lower area A12 of the first side area A1, and the first antenna module 6971 and the second antenna module 6972 may still be separate from each other by the predetermined distance H in one direction (e.g., the vertical direction) of the housing 610. In these arrangements of the antenna modules 6971 and 6972, the vertical distance H between the first antenna module 6971 and the second antenna module 6972 may be set such that at least one of the antenna modules 6971 and 6972 is not covered by a hand of the user when the user grips the electronic device 601 by the housing 610 in a usual fashion. These arrangements may reduce interference with the radiation of electromagnetic waves of the antenna modules 6971 and 6972 by the hand of the user.

Figure 7A:
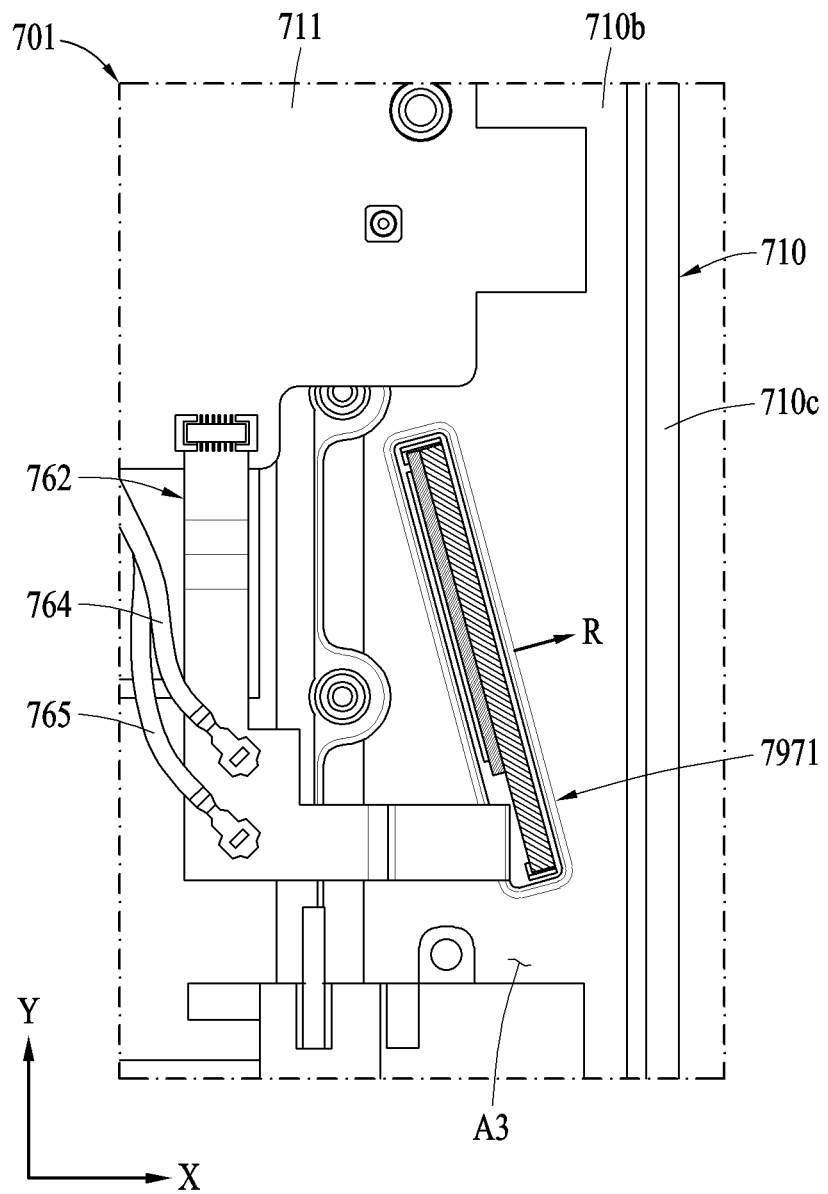
FIG. 7A is a diagram illustrating an example arrangement of antenna modules in an electronic device according to an example embodiment.
Figure 7B:
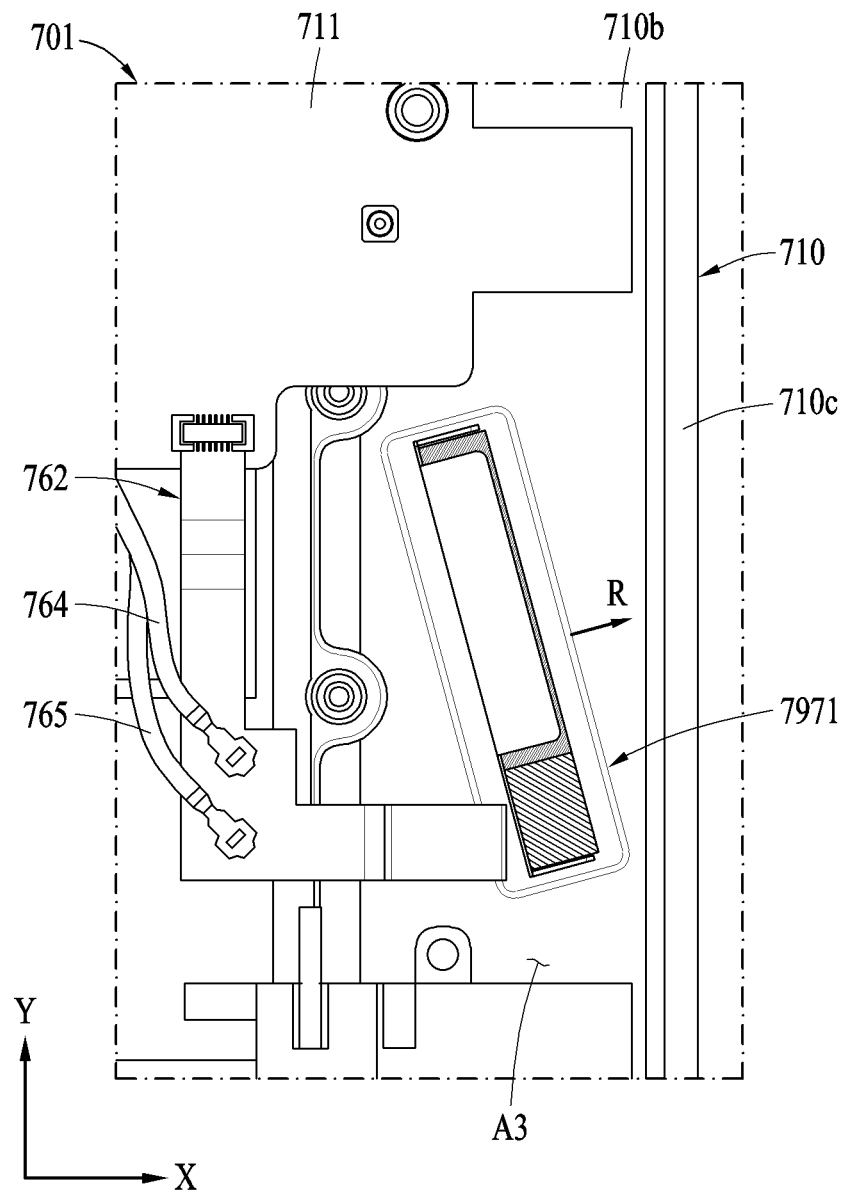
FIG. 7B is a diagram illustrating another example arrangement of antenna modules in an electronic device according to an example embodiment.

Referring to FIGS. 7A and 7B, according to an example embodiment, an electronic device 701 may include a housing 710 (e.g., the housing 210), a first circuit board 711 (e.g., the first circuit board 211), a second circuit board (e.g., the second circuit board 212), a cooling module (e.g., the cooling module 213), a heat plate (e.g., the heat plate 214), a plurality of antenna modules 7971 (e.g., the antenna modules 2971, 2972, 2973, and 2974), a battery (e.g., the battery 289), a plurality of flexible cables 762 (e.g., the flexible cables 261, 262, and 263), a plurality of coaxial cables 764 and 765 (e.g., the first coaxial cable 264 and the second coaxial cable 265), and a compatible cable (e.g., the compatible cable 266). The housing 710 may have a first surface (e.g., front surface) (not shown), a second surface 710*b* (e.g., rear surface, or the second surface 210*b*) opposite to the first surface, and a plurality of third surfaces 710*c* (e.g., side faces) defining the internal space between with the first surface and the second surface 710*b*.

For example, an antenna module 7971 (e.g., the first antenna module 2971) may be disposed in a side area A3 (e.g., the second side area A3). The side area A3 may be defined by at least a portion of a first side surface (e.g., the first side surface 210*c*-1), at least a portion of a second side surface (e.g., the second side surface 210*c*-2) opposite to the first side surface, and a third side surface 710*c* (e.g., the third side surface 210*c*-3) between the first side surface and the second side surface.

The antenna module 7971 may radiate electromagnetic waves to the outside of the housing 710 in the direction R, where the direction R intersects both the normal direction (e.g., +Y direction) of the first side surface and the normal direction (e.g., +X direction) of the third side surface 710*c*.

According to an example embodiment, the antenna module 7971 may be arranged vertically in the housing 710 as illustrated in FIG. 7A. According to another example embodiment, the antenna module 7971 may be arranged horizontally in the housing 710 as illustrated in FIG. 7B.

In addition, when the antenna module 7971 is disposed in another side area (e.g., the first side area A1), the antenna module 7971 may radiate electromagnetic waves to the outside of the housing 710 in a direction that intersects both the normal direction (e.g., −Y direction) of the first side surface, a portion of which is defining the other side area, and the normal direction (e.g., −X direction) of the third side surface.

Such a tilted structure of the antenna module 7971 may reduce or prevent signal attenuation occurring due to radiation interference in the antenna module 7971, where the radiation interference may be caused by the presence of an object (e.g., mouse) beside the third side surface 710*c* of the housing 710. This way, performance of the antenna module 7971 may be improved.

Figure 8A:
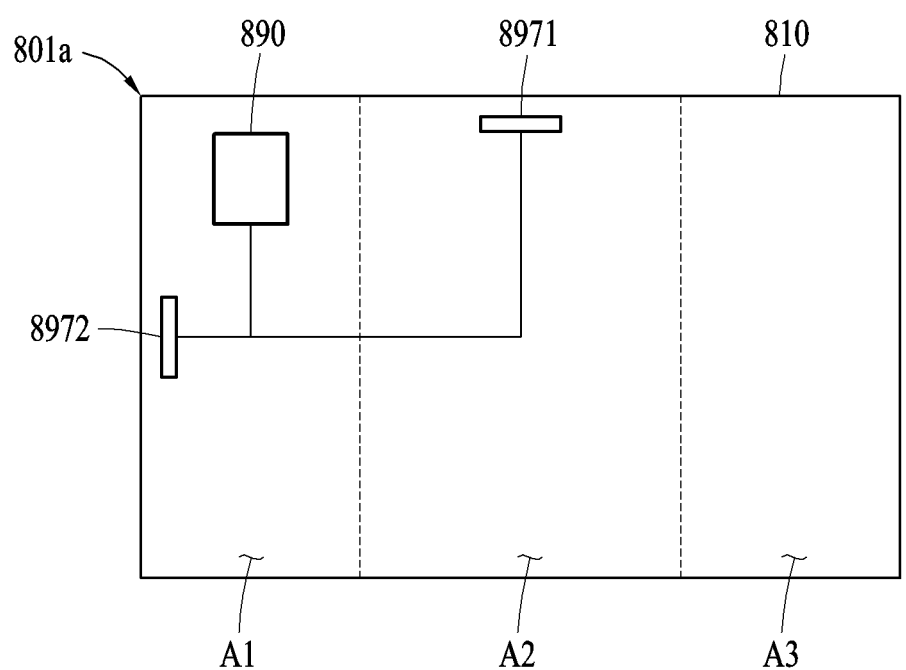
FIG. 8A is a diagram illustrating an example arrangement of a communication module and antenna modules in an electronic device according to an example embodiment.

Referring to FIG. 8A, according to an example embodiment, an electronic device 801*a* may have a layout that includes, within a housing 810 (e.g., the housing 210) having a first side area A1, a middle area A2, and a second side area A3, a communication module 890 (e.g., the communication module 290) disposed in an upper area of the first side area A1, a first antenna module 8971 (e.g., the first antenna module 2971) disposed in an upper area of the middle area A2, and a second antenna module 8972 (e.g., the second antenna module 2972) disposed in a middle area of the first side area A1. The first antenna module 8971 and the second antenna module 8972 may disposed vertically in the housing 810.

Figure 8B:
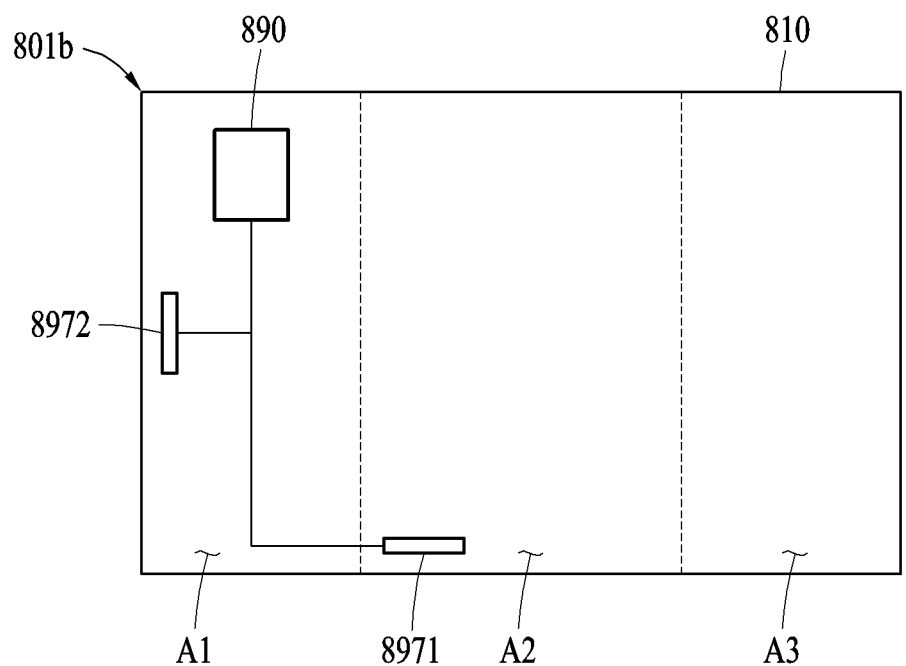
FIG. 8B is a diagram illustrating another example arrangement of a communication module and antenna modules in an electronic device according to an example embodiment.

Referring to FIG. 8B, according to an example embodiment, an electronic device 801*b* may have a layout that includes, within the housing 810, the communication module 890 disposed in the upper area of the first side area A1, the first antenna module 8971 disposed in a lower area of the middle area A2, and the second antenna module 8972 disposed in a middle area of the first side area A1. The first antenna module 8971 and the second antenna module 8972 may be disposed vertically in the housing 810.

Figure 8C:
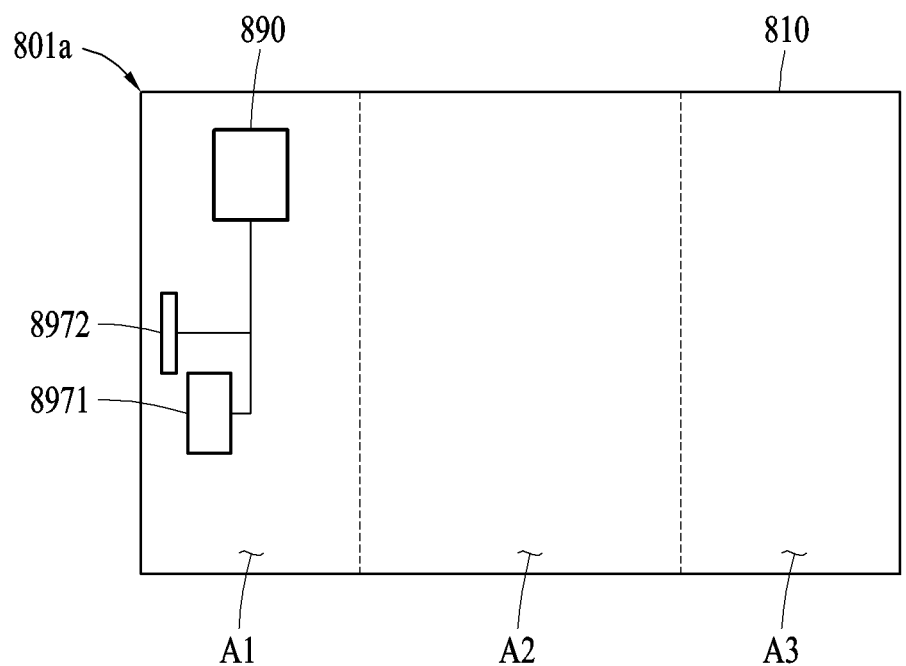
FIG. 8C is a diagram illustrating still another example arrangement of a communication module and antenna modules in an electronic device according to an example embodiment.

Referring to FIG. 8C, according to an example embodiment, an electronic device 801*c* may have a layout that includes, within the housing 810, the communication module 890 disposed in the upper area of the first side area A1, the first antenna module 8971 disposed in a lower area of the first side area A1, and the second antenna module 8972 disposed in a middle area of the first side area A1. The first antenna module 8971 may be disposed horizontally in the housing 810, and the second antenna module 8972 may be disposed vertically in the housing 810.

According to an example embodiment, an electronic device (e.g., 201) may include a first circuit board (e.g., 211), a second circuit board (e.g., 212) including a communication module (e.g., 290), a first antenna module (e.g., 2971) disposed separately from the communication module, a flexible cable (e.g., 262) including a first connector (e.g., 2621) connected to the first circuit board, a second connector (e.g., 2622) connected to the first antenna module, a first extension (e.g., 2623) extending between the first connector and the second connector, and a first receptacle (e.g., 2624) disposed on the first extension, and a first coaxial cable (e.g., 264) including a third connector (e.g., 2641) connected to the communication module, a fourth connector (e.g., 2642) connected to the first receptacle, and a second extension (e.g., 2643) extending between the third connector and the fourth connector.

The first extension may have a flat face (e.g., F2), and the first receptacle may be disposed on the flat face.

The first extension may include a bent face (e.g., B2) between the first receptacle and the second connector, or there may not be any bent face formed between the first receptacle and the second connector.

The electronic device may further include a reinforcing portion (e.g., 267) configured to reinforce the flat face.

The flexible cable may further include a second receptacle (e.g., 2625) disposed to be offset from the first receptacle in the first extension, and the electronic device may further include a second coaxial cable (e.g., 265) including a fifth connector (e.g., 2651) connected to the communication module, a sixth connector (e.g., 2652) connected to the second receptacle, and a third extension extending between the fifth connector and the sixth connector.

The electronic device may further include a second antenna module (e.g., 2972) disposed separately from the communication module, and a compatible cable (e.g., 266) including a seventh connector (e.g., 2661) connected to the communication module, an eighth connector (e.g., 2662) connected to the second antenna module, and a fourth extension (e.g., 2663) extending between the seventh connector and the eighth connector. The communication module may include a first antenna port (e.g., P11) to which the third connector is connected, a second antenna port (e.g., P12) to which the fifth connector is connected, and a third antenna port (e.g., P2) to which the seventh connector is connected.

The electronic device may further include a housing (e.g., 210) including a first side area A1 and a second side area A3 opposite to the first side area A1, and the communication module may be disposed in the first side area A1 and the first antenna module may be disposed in the second side area A3.

The electronic device may further include the second antenna module disposed in the first side area A1, and the first antenna module may be disposed to be separate from the communication module by a first distance and the second antenna module may be disposed to be separate from the communication module by a second distance less than the first distance.

According to an example embodiment, the first side area A1 may include a first upper area A11 and a first lower area A12, and the second side area A3 may include a second upper area A31 and a second lower area A32. A housing (e.g., 610) may be provided in a first form in which a first antenna module (e.g., 6971) is disposed in the second lower area A32 and a second antenna module (e.g., 6972) is disposed in the first upper area A11, or be provided in a second form in which the first antenna module is disposed in the second upper area A31 and the second antenna module is disposed in the first lower area A12.

According to an example embodiment, a housing (e.g., 710) may have side surfaces (e.g., 710c) defining at least a portion of a second side area A3, and a first antenna module (e.g., 7971) may be tilted with respect to at least a portion of the side surfaces.

The side surfaces may include a first side surface, a second side surface opposite to the first side surface, and a third side surface between the first side surface and the second side surface, and the first antenna module may be tilted to radiate in a direction R crossing each of a normal direction of the first side surface and a normal direction of the third side surface.

According to an example embodiment, an electronic device (e.g., 301) may include a first circuit board, a second circuit board including a communication module, a first antenna module (e.g., 3971) disposed separately from the communication module, a third circuit board (e.g., 315) including a first connector (e.g., 3621) connected to the first circuit board, a second connector (e.g., 3622) connected to the first antenna module, and a first receptacle (e.g., 3624), and a first coaxial cable (e.g., 364) including a third connector connected to the communication module, a fourth connector (e.g., 3642) connected to the first receptacle, and a first extension (e.g., 3643) extending between the third connector and the fourth connector.

The third circuit board may include a sub-board (e.g., 368) including the second connector and the first receptacle, and a flexible cable (e.g., 362) including the first connector and a second extension (e.g., 3623) extending between the first connector and the sub-board. The second extension and the sub-board may be integrally formed and electrically connected.

The sub-board may further include a second receptacle (e.g., 3625) disposed to be offset from the first receptacle on the sub-board. The electronic device may further include a second coaxial cable including a fifth connector connected to the communication module, a sixth connector (e.g., 3652) connected to the second receptacle, and a third extension extending between the fifth connector and the sixth connector.

According to an example embodiment, an electronic device (e.g., 201) may further include a housing (e.g., 210) including a first side area A1 and a second side area A3 opposite to the first side area A1, and a communication module (e.g., 290) may be disposed in the first side area A1 and a first antenna module (e.g., 2971) may be disposed in the second side area A3.

The electronic device may further include a second antenna module (e.g., 2972) disposed in the first side area A1, and the first antenna module may be disposed to be separate from the communication module by a first distance and the second antenna module may be disposed to be separate from the communication module by a second distance less than the first distance.

According to an example embodiment, an electronic device (e.g., 401) may include a first circuit board (e.g., 411), a second circuit board including a communication module, a first antenna module (e.g., 4971) disposed separately from the communication module and including a first receptacle (e.g., 4624), and a first coaxial cable (e.g., 464) including a first connector connected to the communication module, a second connector (e.g., 4642) connected to the first receptacle, and a first extension (e.g., 4643) extending between the first connector and the second connector.

The first antenna module may further include a second receptacle disposed to be offset from the first receptacle in the first antenna module, and the electronic device may further include a second coaxial cable including a third connector connected to the communication module, a fourth connector connected to the second receptacle, and a second extension extending between the third connector and the fourth connector.

According to an example embodiment, an electronic device (e.g., 201) may further include a housing (e.g., 210) including a first side area A1 and a second side area A3 opposite to the first side area A1, and a communication module (e.g., 290) may be disposed in the first side area A1 and a first antenna module (e.g., 2971) may be disposed in the second side area A3.

The electronic device may further include a second antenna module (e.g., 2972) disposed in the first side area A1, and the first antenna module may be disposed to be separate from the communication module by a first distance and the second antenna module may be disposed to be separate from the communication module by a second distance less than the first distance.

Although the present disclosure has been described with various example embodiments, various changes and modifications may be suggested to one skilled in the art. It is intended that the present disclosure encompasses such changes and modifications as fall within the scope of the appended claims.

What is claimed is:
1. An electronic device comprising:
   a first circuit board;
   a second circuit board including a communication module;
   a first antenna module disposed to be separate from the communication module;
   a flexible cable including a first connector connected to the first circuit board, a second connector connected to the first antenna module, a first extension connecting the first connector and the second connector, and a first receptacle disposed in the first extension; and
   a first coaxial cable including a third connector connected to the communication module, a fourth connector connected to the first receptacle, and a second extension connecting the third connector and the fourth connector.

2. The electronic device of claim 1, wherein the first extension has a flat portion, and the first receptacle is disposed on the flat face.

3. The electronic device of claim 2, wherein the first extension further comprises a bent portion between the first receptacle and the second connector.

4. The electronic device of claim 2, further comprising: a reinforcing portion configured to reinforce the flat portion.

5. The electronic device of claim 1, wherein the flexible cable further comprises a second receptacle disposed to be offset from the first receptacle in the first extension, and
   the electronic device further comprising:
   a second coaxial cable comprising a fifth connector connected to the communication module, a sixth connector connected to the second receptacle, and a third extension connecting the fifth connector and the sixth connector.

6. The electronic device of claim 5, further comprising:
   a second antenna module disposed to be separate from the communication module; and a compatible cable comprising a seventh connector connected to the communication module, an eighth connector connected to the second antenna module, and a fourth extension connecting the seventh connector and the eighth connector, wherein the second circuit board includes a first antenna port to which the third connector is connected, a second antenna port to which the fifth connector is connected, and a third antenna port to which the seventh connector is connected.

7. The electronic device of claim 1, further comprising:

a housing including a first side area and a second side area opposite to the first side area, wherein the communication module is disposed in the first side area, and the first antenna module is disposed in the second side area.

8. The electronic device of claim 7, further comprising:

a second antenna module disposed in the first side area, wherein the first antenna module is disposed to be separate from the communication module by a first distance, and the second antenna module is disposed to be separate from the communication module by a second distance less than the first distance.

9. The electronic device of claim 8, wherein the first side area comprises a first upper area and a first lower area, and the second side area comprises a second upper area and a second lower area, wherein the first antenna module is disposed in the second lower area and the second antenna module is disposed in the first upper area, or the first antenna module is disposed in the second upper area and the second antenna module is disposed in the first lower area.

10. The electronic device of claim 7, wherein the housing has side surfaces defining at least a portion of the second side area, and the first antenna module is tilted with respect to at least a portion of the side surfaces.

11. The electronic device of claim 10, wherein the side surfaces further comprise a first side surface, a second side surface opposite to the first side surface, and a third side surface between the first side surface and the second side surface.

* * * * *